US009161121B2

(12) United States Patent
Meritt et al.

(10) Patent No.: US 9,161,121 B2
(45) Date of Patent: Oct. 13, 2015

(54) DEVICE, HEADPHONES AND AUDIO PLAYER WITH ENVIRONMENTAL SOUND MIXING FUNCTION

(75) Inventors: Ron Meritt, Arroyo Grande, CA (US); Paul John McCloskey, III, Los Angeles, CA (US)

(73) Assignee: East 2 West LLC, Los Angeles, CA (US)

( * ) Notice: Subject to any disclaimer, the term of this patent is extended or adjusted under 35 U.S.C. 154(b) by 499 days.

(21) Appl. No.: 13/491,621

(22) Filed: Jun. 8, 2012

(65) Prior Publication Data

US 2013/0329904 A1  Dec. 12, 2013

(51) Int. Cl.
| | |
|---|---|
| *H04R 1/10* | (2006.01) |
| *H04R 3/00* | (2006.01) |
| *H03G 3/04* | (2006.01) |
| *A61F 2/20* | (2006.01) |

(52) U.S. Cl.
CPC .. *H04R 3/00* (2013.01); *H03G 3/04* (2013.01); *H04R 1/1091* (2013.01); *H04R 2420/01* (2013.01); *H04R 2430/01* (2013.01)

(58) Field of Classification Search
CPC .... H04R 3/00; H04R 1/1091; H04R 2420/01; H04R 2430/01; H03G 3/04
USPC ................................................ 381/74, 79, 72
See application file for complete search history.

(56) References Cited

U.S. PATENT DOCUMENTS

| 7,395,090 B2 * | 7/2008 | Alden ........................... 455/557 |
| 2005/0201568 A1 * | 9/2005 | Goyal ............................. 381/74 |
| 2007/0223717 A1 * | 9/2007 | Boersma ......................... 381/74 |

* cited by examiner

*Primary Examiner* — Vivian Chin
*Assistant Examiner* — Ammar Hamid
(74) *Attorney, Agent, or Firm* — CKC & Partners Co., Ltd.

(57) ABSTRACT

A device with an environmental sound mixing function includes a case, an input jack, an output jack, a microphone, a mixing module and an output detecting module. The case includes a hole. The input jack and the output jack are disposed on the case. The microphone is disposed in the case and aligned with the hole. The mixing module is electrically connected to the input jack, the output jack and the microphone. The microphone receives an environmental sound through the hole and converts the environmental sound into a microphone signal. The mixing module receives an audio signal through the input jack, mixes the audio signal with the microphone signal to generate a mixed signal, and outputs the mixed signal through the output jack. When the output detecting module detects that headphones are connected to the output jack, the output detecting module drives the mixing module to start operating.

17 Claims, 5 Drawing Sheets

DEVICE, HEADPHONES AND AUDIO PLAYER WITH ENVIRONMENTAL SOUND MIXING FUNCTION

BACKGROUND

1. Technical Field

The present invention relates to a device, headphones and an audio player with an environmental sound mixing function.

2. Description of Related Art

Headphones are a pair of small loudspeakers which are designed to be held in place close to a users ears. The loudspeakers produce sound in response to an audio signal. Some headphones have wires which allow them to be connected to a signal source, such as an audio amplifier, radio, CD player, or portable media player.

In-ear headphones are small and without a headband, and are inserted in the user's ear canals. Many in-ear headphones block out much environmental noise by obstructing the users' ear canals.

When people wear headphones, they may not hear much of the environmental noise around them. One negative consequence of this has been that the number of accidents involving pedestrians wearing headphones has increased in recent years.

SUMMARY

According to one embodiment of this invention, a device with an environmental sound mixing function is disclosed. The device includes a case, an input jack, an output jack, a microphone a mixing module and an output detecting module. The case includes a hole. The input jack and the output jack are both disposed on the case. The microphone is disposed in the case and aligned with the hole of the case. The microphone receives an environmental sound through the hole and converts the environmental sound into a microphone signal. The mixing module is electrically connected to the input jack, the output jack and the microphone. The mixing module receives an audio signal through the input jack, mixes the audio signal with the microphone signal to generate a mixed signal, and outputs the mixed signal through the output jack. The output detecting module detects if headphones are connected to the output jack. When headphones are connected to the output jack, the output detecting module drives the mixing module to start to receive an audio signal through the input jack, to mix the audio signal with the microphone signal corresponding to the environmental sound to generate a mixed signal, and to output the mixed signal through the output jack.

According to another embodiment of this invention, headphones with an environmental sound mixing function are disclosed. The headphones include an audio signal receiving module, at least one loudspeaker, a microphone, a mixing module and a connection detecting module. The microphone converts an environmental sound into a microphone signal. The mixing module is electrically connected to the audio signal receiving module, the loudspeaker and the microphone. The mixing module receives an audio signal from the audio signal receiving module, mixes the audio signal with the microphone signal to generate a mixed signal, and drives the loudspeaker to generate a mixed sound corresponding to the mixed signal. The connection detecting module detects if the audio signal receiving module builds a connection with an external device for receiving the audio signal. When the audio signal receiving module builds a connection with an external device, the connection detecting module drives the mixing module to start to receive an audio signal from the audio signal receiving module, to mix the audio signal with the microphone signal corresponding to the environmental sound to generate a mixed signal, and to drive the loudspeaker to generate a mixed sound corresponding to the mixed signal.

According to another embodiment of this invention, an audio player with an environmental sound mixing function is disclosed. The audio player includes a case, a sound playing unit, an output jack, a microphone, a mixing module and an output detecting module. The case includes a hole. The sound playing unit generates an audio signal. The output jack is disposed on the case. The microphone is, disposed in the case and aligned with the hole of the case. The microphone receives an environmental sound through the hole and converts the environmental sound into a microphone signal. The mixing module is electrically connected to the sound playing unit, the output jack and the microphone. The mixing module receives the audio signal, mixes the audio signal with the microphone signal to generate a mixed signal, and outputs the mixed signal through the output jack. The output detecting module detects if headphones are connected to the output jack. When headphones are connected to the output jack, the output detecting module drives the mixing module to start to mix the audio signal with the microphone signal corresponding to the environmental sound to generate the mixed signal, and to output the mixed signal through the output jack.

These and other features, aspects, and advantages of the present invention will become better understood with reference to the following description and appended claims. It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
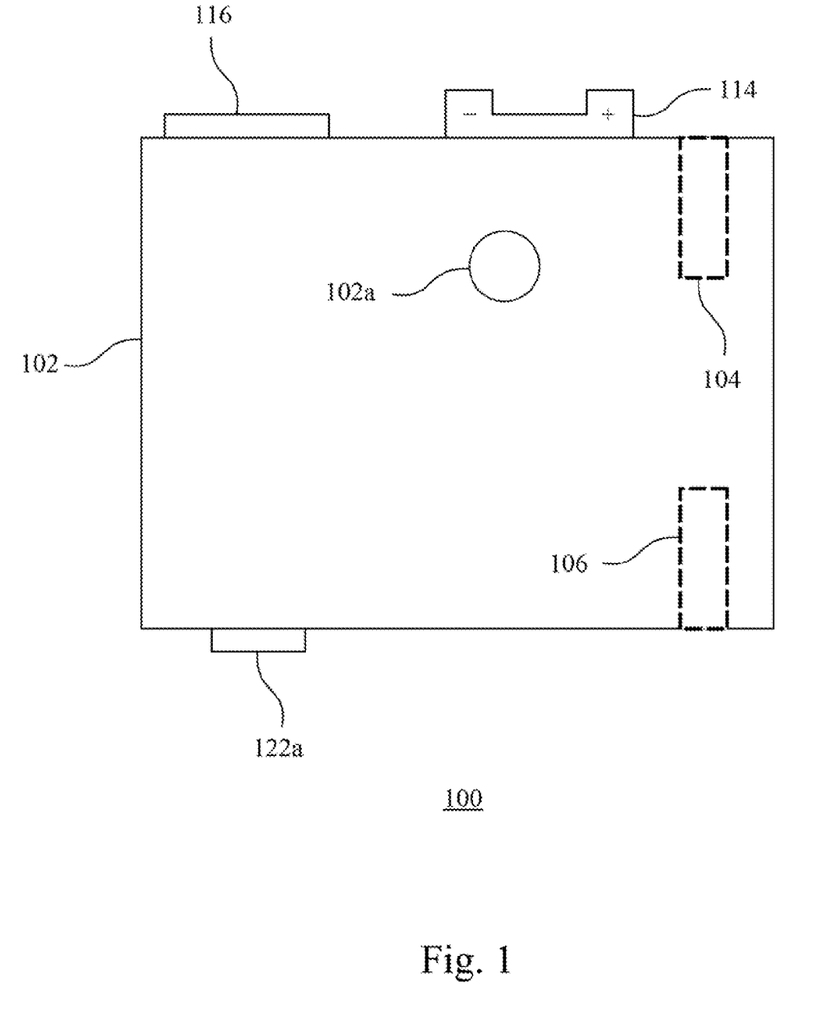
FIG. 1 is a front view of a device with an environmental sound mixing function according to one embodiment of this invention.
Figure 2:
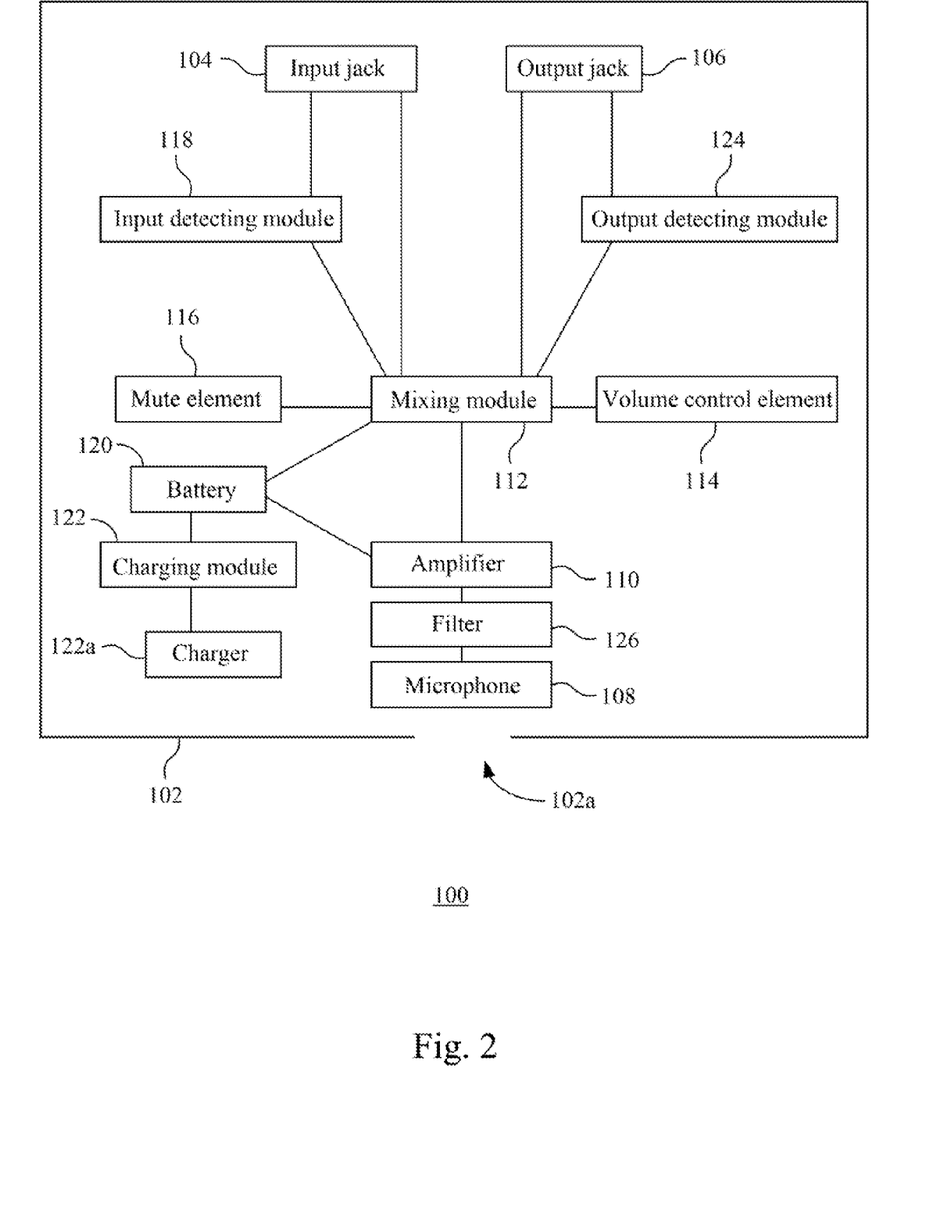
FIG. 2 illustrates a block diagram of the device in FIG. 1.

FIG. 1 is a front view of a device with an environmental sound mixing function according to one embodiment of this invention. FIG. 2 illustrates a block diagram of the device. The device mixes a signal corresponding to an environmental sound with an audio signal to generate a mixed signal for output.

Referring to FIG. 1 and FIG. 2, the device 100 includes a case 102, an input jack 104, an output jack 106, a microphone 108, and a mixing module 112 and an output detecting module 124. The case 102 includes a hole 102a. The input jack 104 and the output jack 106 are both disposed on the case 102. The microphone 108 is disposed in the case 102 and aligned with the hole 102a of the case 102. The mixing module 112 is electrically connected to the input jack 104, the output jack 106 and the microphone 108.

The input jack 104 can be connected to an audio source, such as an MP3 (MPEG, or Moving Picture Experts Group, Audio Layer III) player, a portable multimedia device, a smart phone or any other device which can input an audio signal to the input jack 104. The output jack 104 can be connected to a pair of headphones (not shown).

The microphone 108 receives an environmental sound around the device 100 through the hole 102a, converts the environmental sound into a microphone signal, and outputs the microphone signal. The mixing module 112 receives an audio signal through the input jack 104. Subsequently, the mixing module 112 mixes the audio signal with the microphone signal to generate a mixed signal, and then outputs the mixed signal through the output jack 106. As an example, the mixed signal may be output through the output jack 106 to a pair of headphones connected to the output jack 106, and the headphones generate a corresponding mixed sound. In some embodiments, the device 100 may further include an amplifier 110, which is electrically connected to the microphone 108 and the mixing module 112. Hence, the amplifier 110 may amplify the microphone signal and output an amplified microphone signal to the mixing module 112 for mixing.

Therefore, even if a user is wearing headphones to hear sounds generated in response to the mixed signal output by the device 100, he/she will not have an accident due to an inability to hear environmental sounds. In some embodiments, a user can aim the hole 102a at his/her target, such that the device 100 can be used as a hearing aid.

The output detecting module 124 detects if headphones are connected to the output jack 106. When headphones are connected to the output jack 106, the output detecting module 124 drives the mixing module 112 to start to receive the audio signal through the input jack 104, to mix the audio signal with the microphone signal corresponding to the environmental sound to generate the mixed signal, and to output the mixed signal to the headphones connected to the output jack 106. Therefore, the device 100 may be triggered automatically when the user inserts a plug of headphones into the output jack 106, such that the user may experience a safe listening experience as a result of environmental sounds being mixed with sounds corresponding to the audio signal.

The device 100 may further include a volume control element 114 for adjusting the amount of the microphone signal (i.e., environmental sound) mixed in the mixed signal through user manipulation of the volume control element 114. Hence, a user can operate the volume control element 114 to increase or lower the amount of the environmental sound he/she hears.

The device 100 may further include a mute element 116 for canceling the audio signal when enabled. That is, when the mute element 116 is enabled, the mixing module 112 mixes none of the audio signal into the mixed signal. Therefore, a user can operate the mute element 116 when he/she wants to hear the environmental sound more clearly without inclusion of the audio signal in the mixed signal.

The device 100 may further include an input detecting module 118 for detecting if the input jack 104 is receiving an audio signal. In some embodiments, the input detecting module 118 can perform such detection by determining if a plug is inserted in the input jack 104. In some other embodiments, the input detecting module 118 can perform such detection by determining if a signal is received by the input jack 104. When the input detecting module 118 determines that no audio signal is detected through the input jack 104, the mixing module 112 outputs the mixed signal corresponding only to the environmental sound without mixing.

The device 100 may further include a battery 120 and a charging module 122, which are electrically connected to each other. The battery 120 is electrically connected to the amplifier 110 and the mixing module 112. The battery 120 supplies power to the amplifier 110 and the mixing module 112. The charging module 122 charges the battery 120 utilizing power from a charger 122a. The charger 122a may provide power from Universal Serial Bus (USB®), or any other interface able to supply power. Therefore, the device 100 is portable with power supplied by the battery 120, which provides convenience. In some embodiments, the battery 120 is electrically connected and supplies power to all elements requiring power for operation.

The device 100 may further include a filter 126 electrically connected to the microphone 108. The filter 126 filters the microphone signal to block unwanted frequencies (such as that of wind noise) from the microphone signal, while allowing other noise such as siren, horns, or noise from cars, trucks or trains to pass through. Subsequently, the mixing module 112 mixes the audio signal with the filtered microphone signal to generate a mixed signal.

Figure 3:
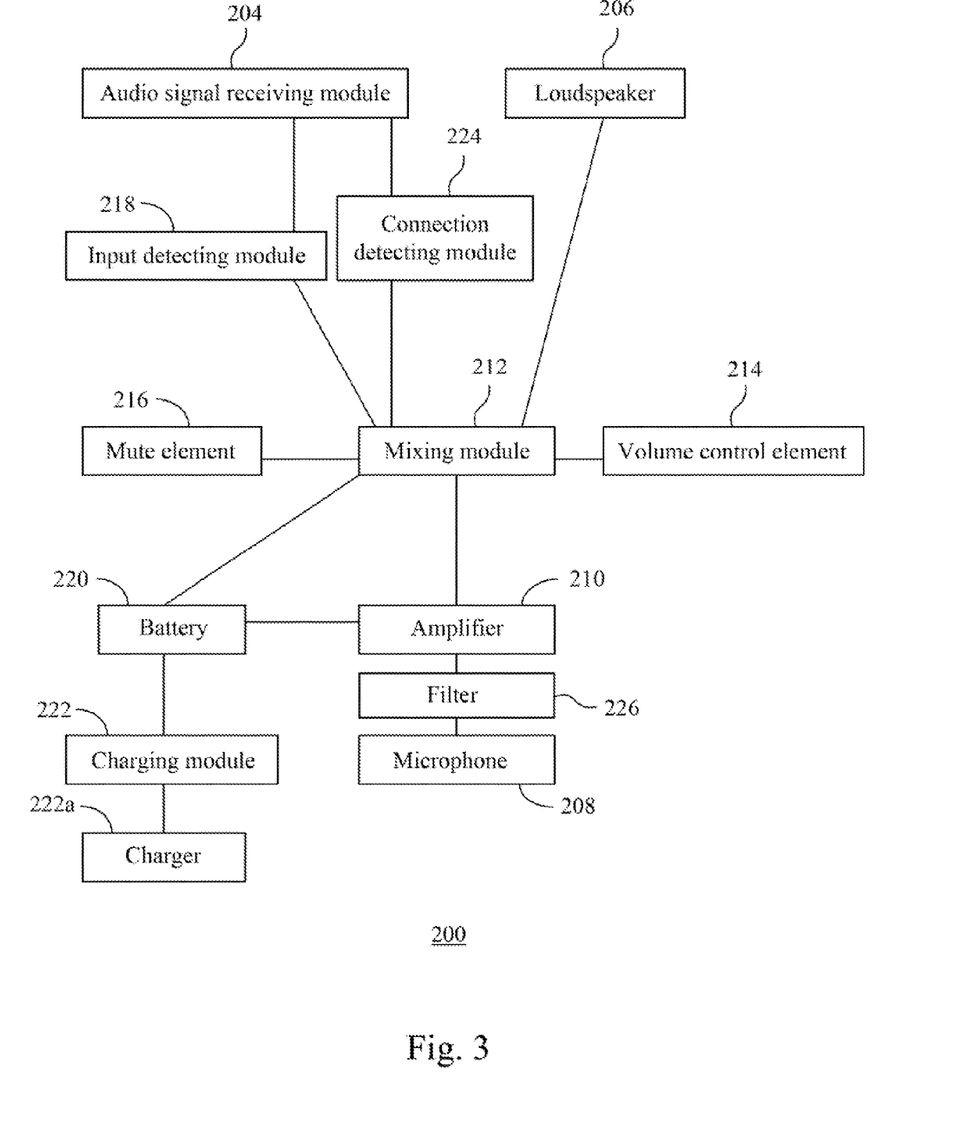
FIG. 3 illustrates a block diagram of headphones with an environmental sound mixing function according to one embodiment of this invention.

FIG. 3 illustrates a block diagram of headphones with an environmental sound mixing function according to one embodiment of this invention. The headphones mix a signal corresponding to an environmental sound with an audio signal to generate a mixed signal which is output to a loudspeaker of the headphones.

The headphones 200 include an audio signal receiving module 204, at least one loudspeaker 206, a microphone 208, a mixing module 212 and the connection detecting module 224. The mixing module 212 is electrically connected to the audio signal receiving module 204, the loudspeaker 206 and the connection detecting module 224.

In some embodiments, the audio signal receiving module 204 may include a plug to insert into an audio player, such as an MP3 player, a portable multimedia device, a smart phone or any other device which can input an audio signal through the plug. In some other embodiments, the audio signal receiving module 204 may build a connection with an audio player through a wired or wireless communication protocol to receive an audio signal.

The microphone 208 receives an environmental sound, converts the environmental sound into a microphone signal, and outputs the microphone signal. The mixing module 210 receives an audio signal from the audio signal receiving module 204. Subsequently, the mixing module 210 mixes the audio signal with the microphone signal to generate a mixed signal, and drives the loudspeaker 206 to generate a mixed sound corresponding to the mixed signal. Therefore, even if a user is wearing the headphones 200, he/she will not have an accident due to an inability to hear environmental sounds. In some embodiments, the headphones 200 can be used as a hearing aid. In some embodiments, the headphones 200 may further includes an amplifier 210, which is electrically connected to the microphone 208 and the mixing module 212. Hence, the amplifier 210 may amplify the microphone signal and output an amplified microphone signal to the mixing module 212 for mixing.

The connection detecting module 224 detects if the audio signal receiving module 204 builds a connection with an external device for receiving the audio signal. When the audio signal receiving module 204 builds a connection with an external device, the connection detecting module 224 drives the mixing module 212 to start to receive an audio signal from the audio signal receiving module 204, to mix the audio signal with the microphone signal corresponding to the environmental sound to generate a mixed signal, and to drive the loudspeaker 206 to generate a mixed sound corresponding to the mixed signal. Therefore, the mixing function may be triggered automatically, such that the user may experience a safe listening experience as a result of environmental sounds being mixed with sounds corresponding to the audio signal.

The headphones 200 may further include a volume control element 214 for adjusting the amount of the microphone signal (i.e., environmental sound) mixed in the mixed signal through user manipulation of the volume control element 214. Hence, a user can operate the volume control element 214 to increase or lower the amount of the environmental sound he/she hears.

The headphones 200 may further include a mute element 216 for canceling the audio signal when enabled. That is, when the mute element 216 is enabled, none of the audio signal is mixed in the mixed signal, and the loudspeaker 206 may generate the mixed sound without the audio signal.

The headphones 200 may further include an input detecting module 218 for detecting if the audio signal receiving module 204 is receiving an audio signal. When no audio signal is detected, the mixing module 212 drives the loudspeaker 206 to generate the mixed sound without mixing. The headphones 200 may further include a battery 220 and a charging module 222, which are electrically connected to each other. The battery 220 is electrically connected to the amplifier 210 and the mixing module 212. The battery 220 supplies power to the amplifier 210 and the mixing module 212. The charging module 222 charges the battery 220 utilizing power from a charger 222a. Therefore, the headphones 200 are portable with power supplied by the battery 220, which provides convenience. In some embodiments, the battery 120 is electrically connected and supplies power to all elements requiring power for operation.

The headphones 200 may further include a filter 226 electrically connected to the microphone 208. The filter 226 filters the microphone signal to block unwanted frequencies (such as that of wind noise) from the microphone signal, while allowing other noise such as siren, horns, or noise from cars, trucks or trains to pass through. Subsequently, the mixing module 212 mixes the audio signal with the filtered microphone signal to generate a mixed signal.

Figure 4:
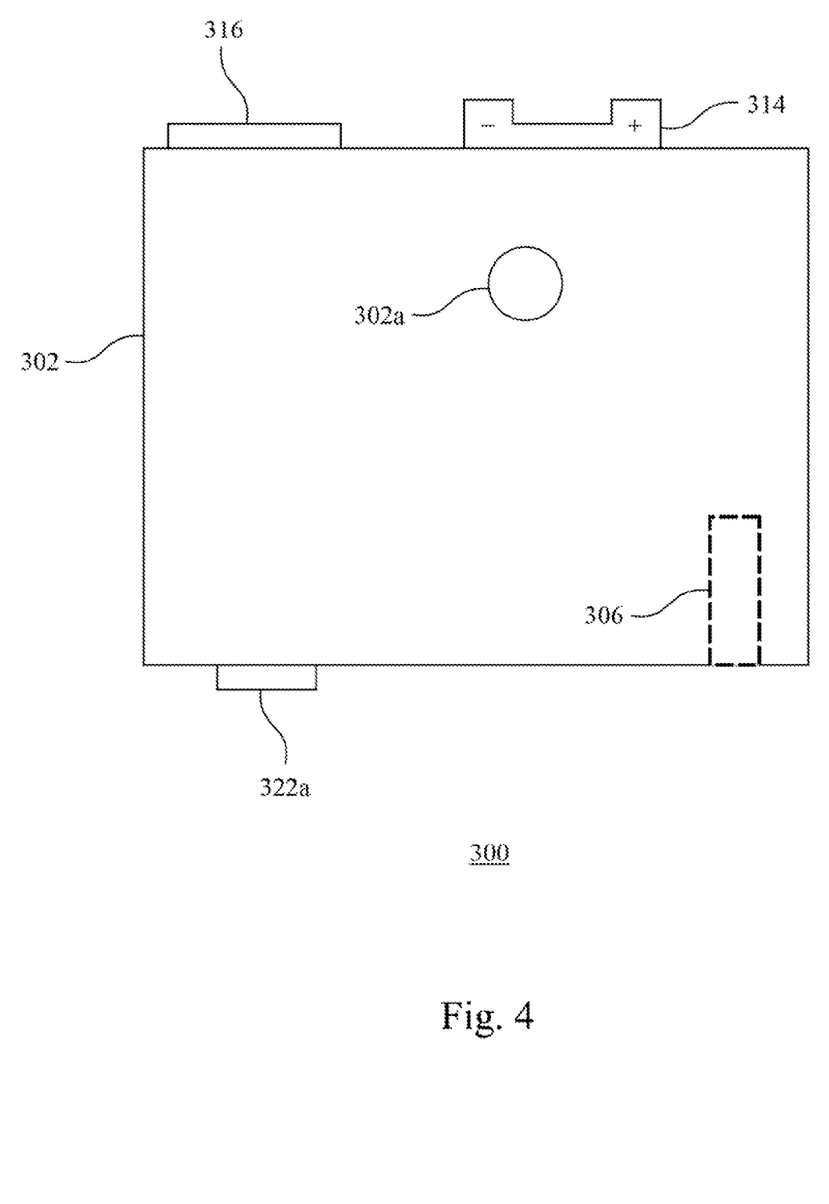
FIG. 4 is a front view of an audio player with an environmental sound mixing function according to one embodiment of this invention.
Figure 5:
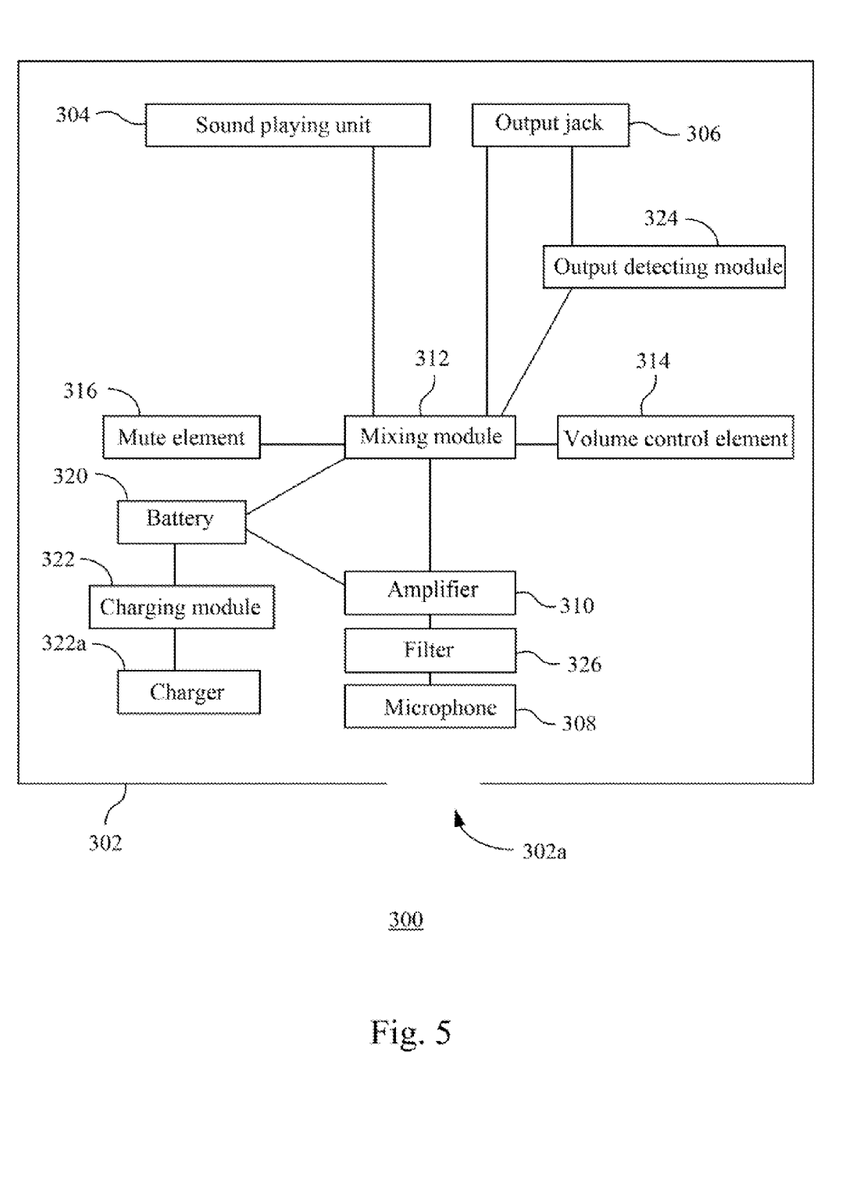
FIG. 5 illustrates a block diagram of the audio player in FIG. 4.

FIG. 4 is a front view of an audio player with an environmental sound mixing function according to one embodiment of this invention. FIG. 5 illustrates a block diagram of the audio player. The audio player mixes a signal corresponding to an environmental sound with an audio signal to generate a mixed signal for output.

Referring to FIG. 4 and FIG. 5, the audio player 300 includes a case 302, a sound playing unit 304, an output jack 306, a microphone 308, a mixing module 312 and an output detecting module 324. The case 302 includes a hole 302a. The output jack 306 is disposed on the case 302. The microphone 308 is disposed in the case 302 and aligned with the hole 302a of the case 302. The mixing module 312 is electrically connected to the sound playing unit 304, the output jack 306 and the output detecting module 324.

The sound playing unit 304 generates an audio signal. In some embodiments, the sound playing unit 304 may generate an audio signal using multimedia files. In some other embodiments, the sound playing unit 304 may generate an audio signal utilizing a multimedia streaming protocol to receive a multimedia stream for generating an audio signal. In other embodiments, the sound playing unit 304 may utilize other methods to generate an audio signal, which should not be limited in this disclosure.

The microphone 308 receives an environmental sound through the hole 302a, converts the environmental sound into a microphone signal, and outputs the microphone signal. The mixing module 312 receives the audio signal from the sound playing unit 304. Subsequently, the mixing module 312 mixes the audio signal with the microphone signal to generate a mixed signal, and outputs the mixed signal through the output jack 306. As an example, the mixed signal may be output through the output jack 106 to a pair of headphones (not shown) connected to the output jack 306, and the headphones generate a corresponding mixed sound. Therefore, even if a user is wearing headphones to hear sounds generated in response to the mixed signal output by the audio player 300, he/she will not have an accident due to an inability to hear environmental sounds. In some embodiments, a user can aim the hole 302a at his/her target, such that the audio player 300 can be used as a hearing aid. In some embodiments, the audio player 300 may further include an amplifier 310, which is electrically connected to the microphone 308 and the mixing module 312. Hence, the amplifier 310 may amplify the microphone signal and output an amplified microphone signal to the mixing module 312 for mixing.

The output detecting module 324 detects if headphones are connected to the output jack 306. When headphones are connected to the output jack 306, the output detecting module 324 drives the mixing module 312 to start to mix the audio signal with the microphone signal corresponding to the environmental sound to generate the mixed signal, and to output the mixed signal through the output jack 306. Therefore, such a mixing function may be triggered automatically when the user inserts headphones into the output jack 306, such that the user may experience a safe listening experience as a result of environmental sounds being mixed with sounds corresponding to the audio signal.

The audio player 300 may further include a volume control element 314 for adjusting the amount of the microphone signal (i.e., environmental sound) mixed in the mixed signal through user manipulation of the volume control element 314. Hence, a user can operate the volume control element 314 to increase or lower the amount of the environmental sound he/she hears.

The audio player 300 may further include a mute element 316 for canceling the audio signal when enabled, such that none of the audio signal is mixed in the mixed signal. Therefore, a user can operate the mute element 316 when he/she wants to hear the environmental sound more clearly without inclusion of the audio signal in the mixed signal.

The audio player 300 may further include a battery 320 and a charging module 322, which are electrically connected to each other. The battery 320 is electrically connected to the amplifier 310 and the mixing module 312 for supplying power to the same. The charging module 322 charges the battery 320 utilizing power from a charger 322a. Therefore, the audio player 300 is portable with power supplied by the battery 320, which provides convenience. In some embodiments, the battery 120 is electrically connected and supplies power to all elements requiring power for operation.

The audio player 300 may further include a filter 326 electrically connected to the microphone 308. The filter 326 filters the microphone signal to block unwanted frequencies (such as that of wind noise) from the microphone signal, while allowing other noise such as siren, horns, or noise from cars, trucks or trains to pass through. Subsequently, the mixing module 312 mixes the audio signal with the filtered microphone signal to generate a mixed signal.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A device with an environmental sound mixing function comprising:
   a case comprising a hole;
   an input jack disposed on the case;
   an output jack disposed on the case;
   a microphone disposed in the case and aligned with the hole of the case, wherein the microphone receives an environmental sound through the hole and converts the environmental sound into a microphone signal;
   a mixing module electrically connected to the input jack, the output jack and the microphone, wherein the mixing module receives an audio signal through the input jack, mixes the audio signal with the microphone signal to generate a mixed signal, and outputs the mixed signal through the output jack;
   an output detecting module for detecting if headphones are connected to the output jack, wherein when headphones are connected to the output jack, the output detecting module drives the mixing module to start to receive an audio signal through the input jack, to mix the audio signal with the microphone signal corresponding to the environmental sound to generate a mixed signal, and to output the mixed signal through the output jack; and
   a filter which filters the microphone signal to block unwanted frequencies while allowing other noise, such that the mixing module mixes the audio signal with the filtered microphone signal to generate a mixed signal.

2. The device with an environmental sound mixing function of claim 1 further comprising:
   a volume control element for adjusting an amount of the microphone signal mixed in the mixed signal in response to user manipulation of the volume control element.

3. The device with an environmental sound mixing function of claim 1 further comprising:
   a mute element for canceling the audio signal when enabled, such that none of the audio signal is mixed in the mixed signal.

4. The device with an environmental sound mixing function of claim 1 further comprising:
   an input detecting module for detecting if the input jack is receiving an audio signal, wherein when no audio signal is detected through the input jack, the mixing module outputs the mixed signal corresponding only to the environmental sound without mixing.

5. The device with an environmental sound mixing function of claim 1 further comprising:
   a battery electrically connected to the mixing module for supplying power to the mixing module; and
   a charging module electrically connected to the battery for charging the battery.

6. The device with an environmental sound mixing function of claim 1 further comprising:
   an amplifier electrically connected to the microphone and the mixing module and which amplifies the microphone signal to generate an amplified microphone signal, such that the mixing module mixes the audio signal with the amplified microphone signal to generate a mixed signal.

7. Headphones with an environmental sound mixing function comprising:
   an audio signal receiving module;
   at least one loudspeaker;
   a microphone which converts an environmental sound into a microphone signal;
   a mixing module electrically connected to the audio signal receiving module, the loudspeaker and the microphone, wherein the mixing module receives an audio signal from the audio signal receiving module, mixes the audio signal with the microphone signal to generate a mixed signal, and drives the loudspeaker to generate a mixed sound corresponding to the mixed signal;
   a connection detecting module for detecting if the audio signal receiving module builds a connection with an external device for receiving the audio signal, wherein when the audio signal receiving module builds a connection with an external device, the connection detecting module drives the mixing module to start to receive an audio signal from the audio signal receiving module, to mix the audio signal with the microphone signal corresponding to the environmental sound to generate a mixed signal, and to drive the loudspeaker to generate a mixed sound corresponding to the mixed signal; and
   a filter which filters the microphone signal to block unwanted frequencies while allowing other noise, such that the mixing module mixes the audio signal with the filtered microphone signal to generate a mixed signal.

8. The headphones with an environmental sound mixing function of claim 7 further comprising:
   a volume control element for adjusting an amount of the microphone signal mixed in the mixed signal in response to user manipulation of the volume control element.

9. The headphones with an environmental sound mixing function of claim 7 further comprising:
   a mute element for canceling the audio signal when enabled, such that none of the audio signal is mixed in the mixed signal.

10. The headphones with an environmental sound mixing function of claim 7 further comprising:
    an input detecting module for detecting if the audio signal receiving module is receiving an audio signal, wherein when no audio signal is detected, the mixing module drives the loudspeaker to generate the mixed sound without mixing.

11. The headphones with an environmental sound mixing function of claim 7 further comprising:
    a battery electrically connected to the mixing module for supplying power to the mixing module; and
    a charging module electrically connected to the battery for charging the battery.

12. The headphones with an environmental sound mixing function of claim 7 further comprising:
    an amplifier electrically connected to the microphone and the mixing module and which amplifies the microphone signal to generate an amplified microphone signal, such that the mixing module mixes the audio signal with the amplified microphone signal to generate a mixed signal.

13. An audio player with an environmental sound mixing function comprising:

a case comprising a hole;
a sound playing unit which generates an audio signal;
an output jack disposed on the case;
a microphone disposed in the case and aligned with the hole of the case, wherein the microphone receives an environmental sound through the hole and converts the environmental sound into a microphone signal;
a mixing module electrically connected to the sound playing unit, the output jack and the microphone, wherein the mixing module receives the audio signal, mixes the audio signal with the microphone signal to generate a mixed signal, and outputs the mixed signal through the output jack;
an output detecting module for detecting if headphones are connected to the output jack, wherein when headphones are connected to the output jack, the output detecting module drives the mixing module to start to mix the audio signal with the microphone signal corresponding to the environmental sound to generate the mixed signal, and to output the mixed signal through the output jack; and
a filter which filters the microphone signal to block unwanted frequencies while allowing other noise, such that the mixing module mixes the audio signal with the filtered microphone signal to generate a mixed signal.

14. The audio player with an environmental sound mixing function of claim 13 further comprising:
a volume control element for adjusting an amount of the microphone signal mixed in the mixed signal in response to user manipulation of the volume control element.

15. The audio player with an environmental sound mixing function of claim 13 further comprising:
a mute element for canceling the audio signal when enabled, such that none of the audio signal is mixed in the mixed signal.

16. The audio player with an environmental sound mixing function of claim 13 further comprising:
a battery electrically connected to the mixing module for supplying power to the mixing module; and
a charging module electrically connected to the battery for charging the battery.

17. The audio player with an environmental sound mixing function of claim 13 further comprising:
an amplifier electrically connected to the microphone and the mixing module and which amplifies the microphone signal to generate an amplified microphone signal, such that the mixing module mixes the audio signal with the amplified microphone signal to generate a mixed signal.

* * * * *